United States Patent [19]

Kroger

[11] Patent Number: 4,490,733
[45] Date of Patent: Dec. 25, 1984

[54] JOSEPHSON DEVICE WITH TUNNELING BARRIER HAVING LOW DENSITY OF LOCALIZED STATES AND ENHANCED FIGURES OF MERIT

[75] Inventor: Harry Kroger, Sudbury, Mass.

[73] Assignee: Sperry Corporation, New York, N.Y.

[21] Appl. No.: 434,791

[22] Filed: Oct. 15, 1982

[51] Int. Cl.³ .................. H01L 45/00; H01L 27/12; H01L 39/22; H01L 49/02
[52] U.S. Cl. .......................................... 357/5; 357/2; 357/4; 357/6; 427/63
[58] Field of Search ................... 357/6, 5, 4, 2; 427/63

[56] References Cited

U.S. PATENT DOCUMENTS

| | | | |
|---|---|---|---|
| 4,142,195 | 2/1979 | Carlson et al. | 357/2 |
| 4,145,699 | 3/1979 | Hu et al. | 357/5 |
| 4,176,365 | 11/1979 | Kroger | 357/5 |
| 4,342,044 | 7/1982 | Ovshinsky et al. | 357/4 |
| 4,421,785 | 12/1983 | Kroger | 427/63 |

FOREIGN PATENT DOCUMENTS

| | | | |
|---|---|---|---|
| 53-49963 | 5/1978 | Japan | 357/5 |
| 53-90882 | 8/1978 | Japan | 357/5 |

Primary Examiner—Andrew J. James
Assistant Examiner—J. Carroll
Attorney, Agent, or Firm—Howard P. Terry; Arnold L. Albin

[57] ABSTRACT

A superconducting tunnel junction device having superconductive electrodes has a non-homogeneous barrier layer of amorphous semiconductive material, wherein when the central region is deposited in the presence of a gaseous atmosphere containing hydrogen there obtains a reduced density of localized states in the central region of the barrier so as to minimize leakage currents, resulting in improved current-voltage characteristics approximating an ideal tunnel junction device. The low leakage currents improve margins of Josephson logic circuits over tunneling barriers using uniformly deposited hydrogenated silicon with niobium electrodes, and increase the sensitivity of S-I-S microwave and millimeter wave length detectors and mixers. In a preferred embodiment, superconductive electrodes of niobium are conjoined with a tri-layer barrier using pure silicon adjoining the electrodes and a core of hydrogenated amorphous silicon. $V_m$ parameters of merit (product of subgap resistance and critical current) as high as 28 mV at 4.2K were obtained with this embodiment, compared with 10 mV for the prior art.

16 Claims, 13 Drawing Figures

JOSEPHSON DEVICE WITH TUNNELING BARRIER HAVING LOW DENSITY OF LOCALIZED STATES AND ENHANCED FIGURES OF MERIT

BACKGROUND OF THE INVENTION

1. Field of the Invention

This invention pertains to the field of superconducting tunnel junctions and more specifically relates to the field of superconducting tunnel junctions having deposited barriers.

2. Description of the Prior Art

Many metals will exhibit the superconducting state under certain critical parameters, which are all temperature dependent, having their largest numerical values at 0 K. and vanishing at the transition temperature $T_c$. The transition temperature is a constant of the material and varies from a range of 0 K. to approximately 24 K. Niobium is a material of particular interest because of its refractory properties and its relatively high transition temperature $T_c$ of 9.4 K. This means that when cooled with liquid hydrogen to a temperature of approximately 4 K. it will be well below the transition temperature. When the conditions for superconductivity are obtained, the material provides perfect conductivity. However, as the temperature approaches $T_c$, the superconductive properties vanish. In the superconducting state, the electrons form bond pairs. When the critical current of the superconductors is reached, the kinetic energy of the pairs becomes sufficient to result in pair breaking, whereby single electrons are released which scatter, leading to electrical resistance. This will also occur as the transition temperature $T_c$ is reached.

A metal tunnel junction consists of a sandwich of two metal electrodes separated by a thin insulating barrier. While the insulating barrier prohibits bulk state conductivity, it does permit electron transport from one electrode to the other by the tunneling phenomenon. At room temperatures, the conductance of the junction is substantially linear. However, as the junction is cooled below $T_c$ of the electrodes, the current-voltage (I-V) characteristic of the junction becomes non-linear as a result of having developed an energy gap in which there are no available electron states; as a result no current will flow across the junction until the voltage impressed across the junction is equal to the sum of the energy gaps, at which time the electrons can tunnel from one electrode to states above the gap in the other electrode. Such a device, at a temperature below $T_c$, can then be current biased in the zero voltage state and caused to switch under the influence of an input current or magnetic field between the zero voltage state and the resistive state.

Superconducting tunnels junctions are known in the art and are used in both Josephson devices and S-I-S (superconductor-insulator-superconductor) microwave and millimeter wave detectors and mixers. Josephson junctions comprise, for example, two superposed layers of superconductive material with an insulator or semiconductor layer constituting a barrier therebetween, whereby current flows from one superconductive layer to the other through the insulating barrier via the Josephson electron pair tunneling effect. With the superconductive layers connected into a superconductive loop and control lines disposed adjacent the junction, the D.C. Josephson zero voltage current flowing through the device may be controlled so as to provide the necessary current steering control function in the Josephson circuitry. Detectors and mixers have also been devised, based on the quasi-particle (single electron) tunneling currents in superconducting tunnel junctions.

Very important to the use of Josephson junction devices, particularly in logic circuits, are its electrical characteristics, namely, the value of $V_m$, which is a product of the critical current $I_c$ flowing through a junction and the subgap resistance $R_s$. The critical current $I_c$ can be defined as the maximum superconducting current that can flow through the Josephson junction, which if exceeded will result in the junction losing its superconducting property, permitting a voltage drop across the junction. The subgap resistance $R_s$ is the resistance of the junction measured at a voltage less than the sum of the energy gaps of the superconducting electrodes.

The gap energy is the engergy required to disassociate an electron pair and can be supplied by thermal excitation, electric fields, or magnetic fields. When the gap energy is exceeded, the superconducting electrodes revert to the normal metallic state, in which current is manifested by the transfer of single electrons, rather than electron pairs.

It is generally recognized that the higher the value of $V_m$, the more ideal the behavior of the Josephson junction in many digital circuits. That is, the device tends to approach the theoretical current-voltage (I-V) characteristic of an ideal superconducting tunnel junction, in which the leakage current below the energy gaps would vanish at a temperature of absolute zero (T=0 K.).

Tunneling from an electrode to a localized state within the barrier material provides an internal conductive shunt across the junction. To the extent that localized states contribute to conduction, the junction is considered to be non-ideal. When conduction is due to electrode-to-electrode tunneling alone, important properties of the junction, such as the superconducting energy gap, may be determined.

Another figure of merit is the product of the critical current $I_c$ and the normal resistance $R_n$. $R_n$ is the resistance of the device at voltages greater than the sum of the energy gaps of the superconducting electrodes.

A further figure of merit for Josephson devices is the steepness of the rise in quasi-particle current at the sum of the superconducting energy gaps. The steeper the rise, the more useful the device may be in a digital circuit, as noted heretofore. In a superconductor the phenomenon of pairing of electrons is responsible for the lossless supercurrent in the metal electrodes and a Josephson or electron-pair current in S-I-S tunnel junctions. The energy or applied voltage required to break the pair is referred to as the superconducting energy gap. Such pairs when broken create single particle excitations known as quasi-particles. Sufficiently great thermal energy, magnetic fields, or voltage drops across the tunneling junction can break these pairs and create the quasi-particles. As an example, in the prior art certain power supply circuits have been designed for use with latching Josephson logic in which the supply voltage is set by the voltage limiting action of the jump in quasi-particle current. The steeper the step in quasi-particle current at $V_g$, the voltage of the sum of the superconducting energy gaps of the electrodes (see FIG. 5), the more accurate such a voltage regulator will be. [J. Matisoo, *IBM J. Res. Develop.* Vol 24, No. 2, P. 123 (1980)]

Moreover, the prior art studies of the Josephson and quasi-particle devices in applications as very-low-noise detectors and mixers for millimeter wavelengths favor the quasi-particle devices, and based on quantum mode detection theory indicates that a lower frequency operation and conversion gain may be obtained. It is suggested that the availability of conversion gain from a photon-noise-limited mixer would make it appear possible that the performance of millimeter-wave S-I-S heterodyne receivers will approach the quantum noise limit. Thus the prior art shows the advantage for devices with significant improvement in quasi-particle current characteristics [P. L. Richards and T. M. Shen, *IEEE Trans. Electron Devices*, Vol. ED.-27, P. 1909 (1980)]

U.S. Pat. No. 4,176,365, assigned to the Assignee of the present invention, has contemplated using relatively uniform deposited hydrogenated amorphous silicon barriers in cooperation with niobium superconductive electrodes. However, it has been found that interdiffusion or alloying of the electrode material and the hydrogenated semiconductor material could lower the superconducting energy gap adjacent to the barrier, resulting in a reduction of the figure of merit $V_m$, and decreased subgap resistance $R_s$. It is observed that the hydrogen impregnation results in "poisoning" the niobium superconducting electrodes; that is, results in a reduction of the superconducting transition temperature, such that the predicted advantages from the reduction of localized states with hydrogenation are not realized.

The present invention makes it possible to obtain the advantages of hydrogenation, which affords unusually high current density, without attendant loss in the "figures of merit", by providing a composite barrier structure where the region adjacent to the electrodes is free from hydrogen, while the central region of the barrier is hydrogenated in a predetermined amount, such that higher values of $V_m$ and $R_n$ and a more abrupt rise in quasi-particle current at the sum of the energy gaps are observed.

SUMMARY OF THE INVENTION

The present invention provides figures of merit of $V_m$ and $I_cR_n$ which are significantly higher than any published values for niobium-niobium tunnel junctions; and more abrupt rise in quasi-particle current at the sum of the superconducting energy gaps. The invention overcomes the disadvantages of the prior art by utilizing a non-homogeneous barrier construction which provides freedom from or substantial reduction in the density of localized states without poisoning the electrodes.

The present invention comprises a superconducting tunnel junction device having first and second superposed superconductive layers with a tunneling barrier therebetween, the barrier comprised of semiconductive material, fabricated by deposition in a gaseous atmosphere with a portion having a substantially reduced density of localized states so as to minimize leakage current through the barrier, and a portion of the interface between the barrier and at least one of the superconducting electrodes having a normal density of localized states, thereby to prevent poisoning of the electrode. The preferred material for the barrier is amorphous hydrogenated silicon, with the hydrogen concentrated in the central region.

The preferred material for the superconductive electrodes is niobium, but other alloys having superconductive properties are also feasible. Other configurations, including a multiplicity of hydrogenated amorphous silicon layers of varying hydrogen density, are described.

DESCRIPTION OF THE PREFERRED EMBODIMENT

Figure 1:
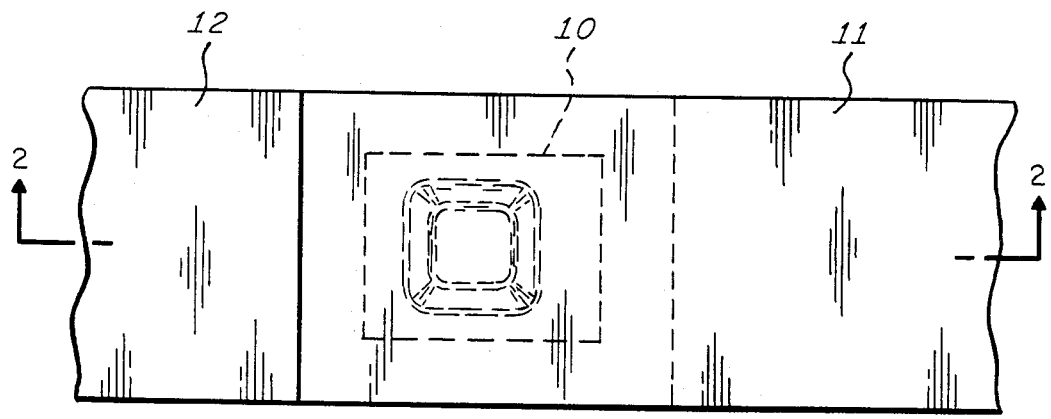
FIG. 1 is a top view of a Josephson tunnel device.
Figure 2:
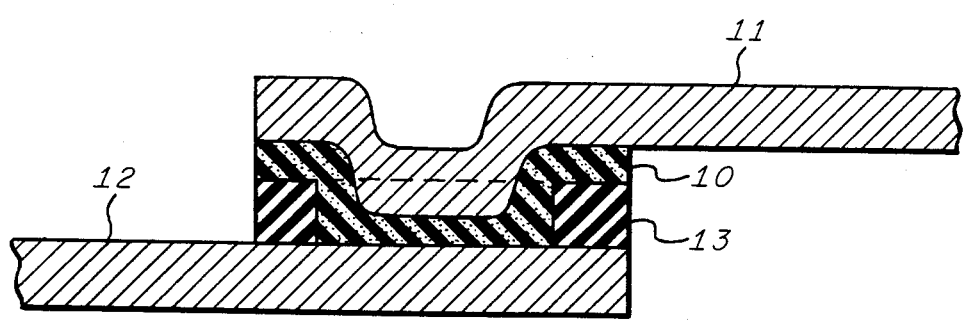
FIG. 2 is a side elevation view of a cross-section of the device of FIG. 1, taken along line 2—2.

Referring to FIGS. 1 and 2, a Josephson tunnel junction device is illustrated. FIG. 1 is a top view thereof and FIG. 2 is a cross-section of the device taken along the line 2—2. The tunnel junction device consists of first and second superposed superconductive layers 11 and 12 with a tunneling barrier 10 therebetween. The superconductive material of the layers 11 and 12 is preferably a refractory metal such as niobium (Nb). The tunneling barrier 10 is comprised of amorphous hydrogenated silicon (a-Si:H) or amorphous hydrogenated germanium (a-Ge:H) or possibly an alloy thereof. A preferred construction of the Josephson junction includes an insulator layer 13 with a rectangular opening therein to define accurately the boundaries of the effective tunneling barrier layer 10. The effective Josephson tunneling barrier is preferably 30–400 Angstrom units thick.

The device may be fabricated with or without the insulator layer 13 with the hole therethrough. This portion of the device defines the tunneling barrier geometry resulting in enhanced reproducibility of device parameters. The layer 13 comprises an insulator such as, for example, silicon dioxide ($SiO_2$).

Figure 3:
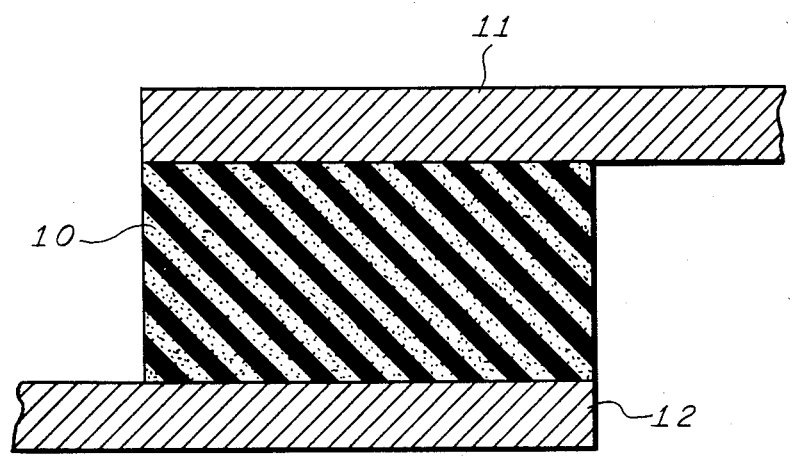
FIG. 3 is an enlarged side elevation view of a cross-section of the device of FIG. 1, taken along line 2—2 and showing a uniform hydrogenated-silicon barrier.

FIG. 3 shows a simplified enlarged view of the tunneling barrier, adapted from FIG. 2 with structural details simplified to place emphasis on the barrier composition, and having a uniform distribution of hydrogen therein. Like numbers refer to similar or identical features in the Figures.

Figure 4:
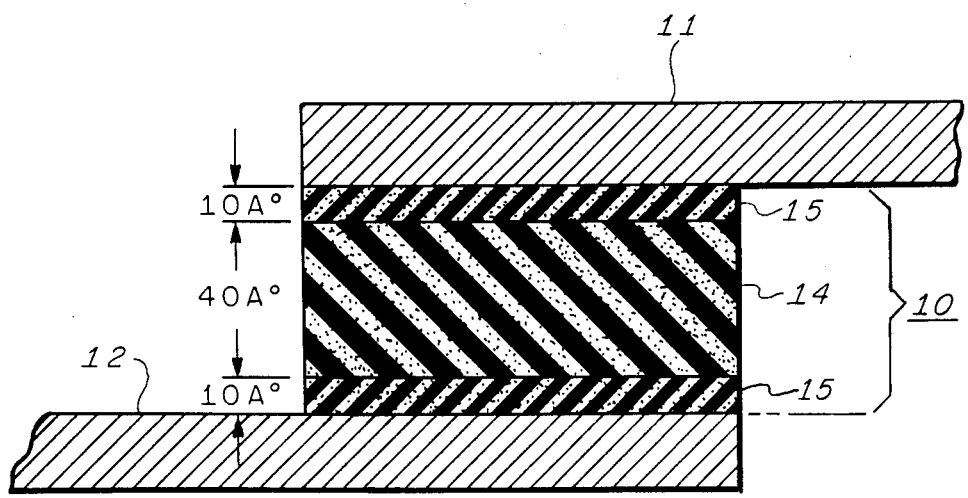
FIG. 4 is an enlarged side elevation view of a cross-section of the device of FIG. 1, taken along line 2—2, showing a hydrogenated barrier of the present invention.

Referring now to FIG. 4, a superconducting tunnel junction device according to the principle of the present invention is shown to have an upper layer 11 and a lower layer 12, constituting the superconductive electrodes, and an included barrier layer 10, having a minimum of localized states. Tunneling barrier 10 is shown to be comprised typically of an inhomogeneous tri-layer structure having a central or core region 14, preferably of amorphous hydrogenated silicon (a-Si:H), and upper and lower barrier layers 15 which may be comprised of substantially pure amorphous silicon (a-Si). The nominal total thickness of the composite silicon-hydrogenated silicon-silicon barrier in the example shown is equal to 60 Angstrom units, in which layers 15 are each 10 Angstrom units thick and the central hydrogenated region 14 is approximately 40 Angstrom units thick. It will be appreciated by those skilled in the art that the sectional views of the invention are illustrative only, and not drawn to scale, and that the electrodes are preferably much thicker than the barrier. For example, for the tri-layer construction shown, an effective Josephson tunneling barrier 10 would preferably range from 30 to 400 Angstrom units total thickness while the electrodes 11, 12 would each be of the order of 3000 Angstrom units in thickness.

The amorphous hydrogenated silicon layer 14 of FIG. 4 is preferably desposited by sputtering in a partial hydrogen atmosphere, thereby hydrogenating the layer. The pure silicon layers 15 are preferably sputter deposited in a pure argon plasma (defined as one containing less than 1 percent hydrogen). Preferably, the gaseous atmosphere of the sputtering chamber will be continuously monitored to assure the integrity and purity of the argon plasma.

Figure 5:
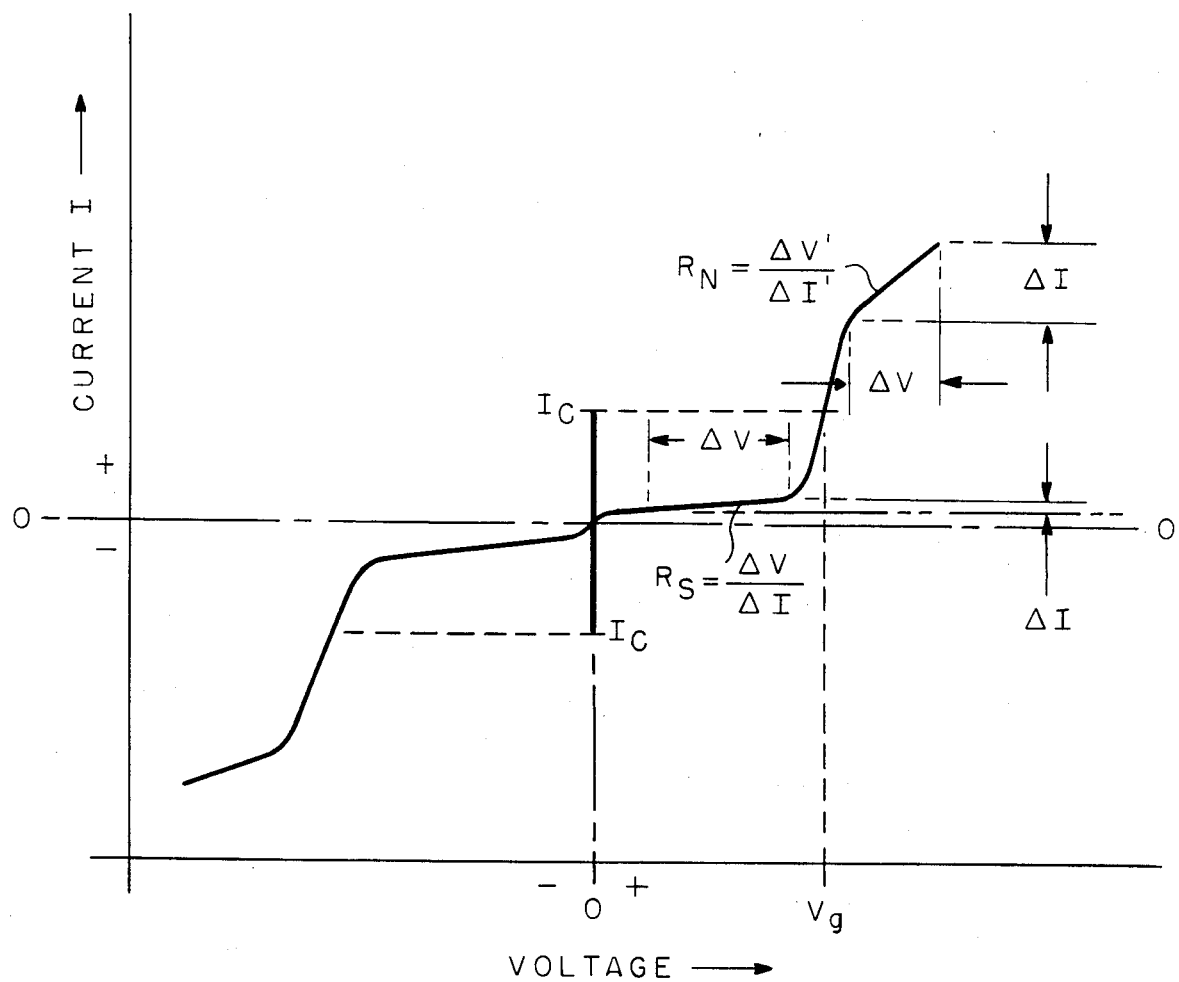
FIG. 5 is a typical curve of the current-voltage characteristic of a superconducting tunnel junction device.

As noted above, the current-voltage (I-V) characteristic curves of the tunneling junction device permit evaluation of the figures of merit, that is, the critical $I_c$, subgap resistance-critical current product $V_m$, and normal resistance-critical current product $I_cR_n$. FIG. 5 shows a hypothetical characteristic curve of a superconducting junction device, showing how the parameters defining the figures of merit are obtained. The higher the value of $V_m$ and the $I_cR_n$ product, the more "ideal" the behavior in many digital circuit applications.

$V_g$ represents the sum of the superconducting energy gaps of the two electrodes. The slope of the curve below $V_g$ represents the superconducting subgap resistance $R_s$, and a relatively high $R_s$ value is typical of devices in which tunneling between the electrodes is the dominant conduction mechanism. $I_c$ represents the critical current, or the maximum current than can be drawn through the tunnel junction while remaining in a superconducting state, i.e., while maintaining the voltage drop across the junction at zero. The normal state resistance $R_n$ is the slope of the curve observed at a point above the superconducting energy gap. It may be seen that when the device is in a non-superconducting state, the current increases slowly with applied voltage until $V_g$ is reached, at which point there is a sharp, almost vertical increase in current and reduction in the resistance of the device. $V_g$ is typically of the order of 1-3 millivolts. The I-V curve approaches a straight line as the voltage is increased, with a slope that is the normal state conductance $R_n$ of the junction. When the current I is increased from I=0, in the superconducting state, the voltage across the junction will remain at zero until I is made greater than $I_c$. At that point, it will jump to the branch of the I-V curve at $V_g$, as shown by the dotted line in FIG. 5. As the current is decreased from a value above $I_c$, the lower branch of the I-V curve will be followed. The curve is symmetrical with respect to the applied voltage polarity, since the barrier device responds accordingly to a change in applied polarity. It should be noted that while all currents shown are due to tunneling through the semiconductive barrier, the superconducting currents are primarily the Josephson electron pairs, while the normal state currents are quasi-particle or single-electron currents. It is desired that quasi-particle currents be minimized in the superconducting state, and that the rise or jump in quasi-particle current at the sum of the energy gaps be maximized.

Figure 6:
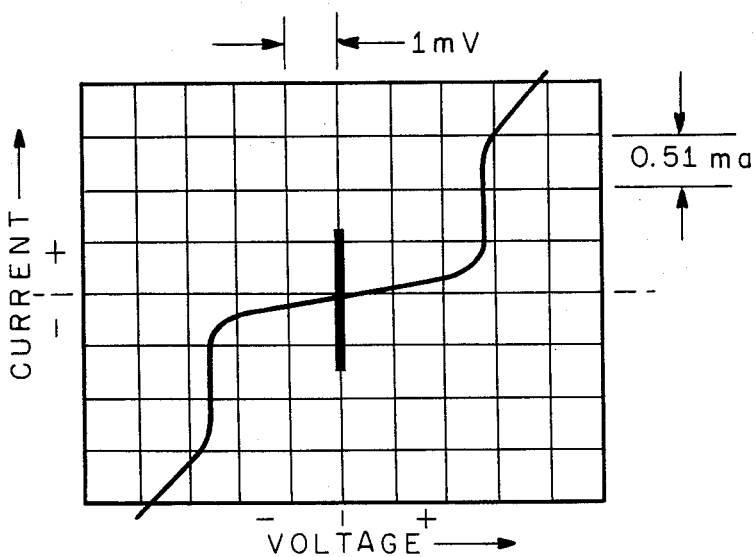
FIG. 6 is the current-voltage characteristic of a superconducting junction with a silicon barrier.
Figure 7:
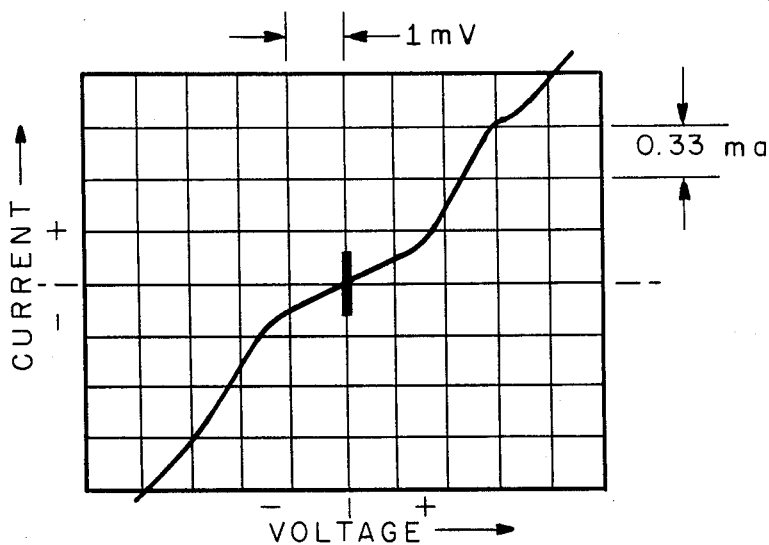
FIG. 7 is the current-voltage characteristic of a superconducting junction with a hydrogenated silicon barrier.
Figure 8:
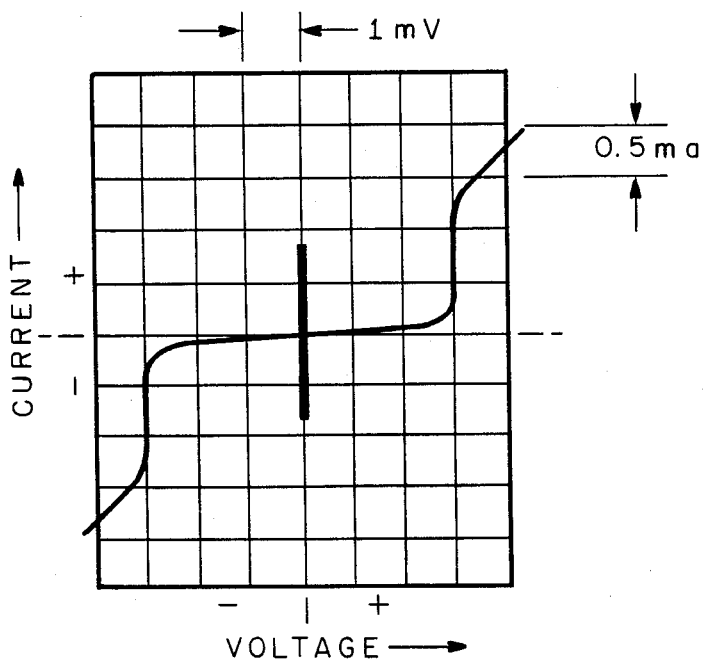
FIG. 8 is the current-voltage characteristic of the present invention with a hydrogenated silicon barrier.

Referring now to FIGS. 6, 7 and 8, experimental I-V curves for three Josephson devices are shown. The term "Josephson device" is defined to include the field of superconducting tunneling junctions, including both Josephson tunnel junctions and S-I-S junctions (S-I-S junctions are also fabricated as Josephson devices even though the Josephson effect is not utilized.) FIG. 6 shows the I-V curve for a Nb-Si-Nb Josephson tunnel junction in which a uniform silicon barrier of approximately 60 Angstrom units thickness was sputter deposited in a pure argon plasma. The value of $V_m$ (product of the critical current $I_c$ and subgap resistance measured at 1.5 mv) was noted to be 10 millivolts. The $I_cR_n$ product is typically 1.3 mv. FIG. 7 displays the I-V characteristic of a Nb-Si:H-Nb device in which barrier layer 10 is comprised of 60 Angstrom units thickness of amorphous hydrogenated silicon, and electrodes 11 and 12 are both niobium. The entire barrier was produced by a reactive sputtering process in an argon/$H_2$ atmosphere. In this particular case the partial pressure of argon was 8 mill Torr and the partial pressure of hydrogen was 0.5 milliTorr. It should be noted that the $V_m$ parameter is relatively low at approximately 2 millivolts and, furthermore, the $I_cR_n$ product is also lower than the device whose characteristics are displayed in FIG. 6. This is attributed to poisoning of the niobium electrodes by the hydrogen as previously discussed.

The present invention acts to preserve the isolation of the niobium from the hydrogenated silicon layer, thus leading to the improved results to be discussed. FIG. 8 displays the I-V characteristics of a Nb-Si-Si:H-Si-Nb device constructed according to the present invention and shown in cross-section in FIG. 4. $V_m$ equals approximately 28 millivolts and the $I_cR_n$ product is equal to 1.7 millivolts, realizing a substantial improvement over the junction of FIG. 7.

The nominal total thickness of the composite Si-Si:H-Si barrier of FIG. 4 is the same as that of each of the barriers of the devices of FIGS. 2 and 3. In the non-homogeneous barrier, each unhydrogenated portion is nominally 10 Angstrom units thick; the central hydrogenated region is nominally 40 Angstrom units thick. The unhydrogenated silicon regions were sputtered in an argon plasma of 8 mT pressure, as was the device of FIG. 2; the central hydrogenated region was deposited in a partial pressure of 8 mT Ar and 0.5 mT$H_2$, exactly as the device of FIG. 3. Both the $V_m$ and $I_cR_n$ figures of merit of FIG. 8, which corresponds to the device in FIG. 4, are significantly higher than any published values for Nb/Nb tunnel junctions. These improved results are reproducible at least qualitatively. ($V_m > 20$ mV has twice been obtained with the Si-Si:H-Si tri-layer, whereas, the "best" simple barrier yielded only $V_m = 12$ mv). The practical improvement in $V_m$ is, in fact, better than that implied in these numbers. The best (highest) $V_m$ is obtained in the simple barriers at an applied voltage of 1.5-1.7 mV; the best $V_m$ in the tri-layer barrier is obtained at 2.0 mV. The higher the voltage at which a high $V_m$ is observed, the greater the voltage to which logic devices can be switched, resulting in improved logic gates by virtue of better margins between the "on" and "off" conditions.

FIG. 6 shows the I-V characteristic curve of a Josephson tunnel junction resulting from tests on a sample in which the barrier was a uniform layer of pure silicon. While tests on junctions fabricated with amorphous hydrogenated silicon barriers of the prior art had shown substantial improvement in properties such as the bulk resistivity and high critical current density, it was also observed, as may be seen from FIG. 7, that there is a substantial departure from the I-V characteristic of FIG. 6. This has been attributed to poisoning of the niobium electrodes. It has been observed that even minor contamination of niobium electrodes will result in undesirable lowering of the transition temperature. Such contamination can occur by proximity to a non-superconducting material, or by actual impregnation of the niobium by the contaminants. Further, by facilitating the travel of quasi-particle or single electrons between the electrodes, albeit by the tunneling mode, which may be considered leakage currents, poisoning results in impaired figures of merit. It is therefore an object of the present invention to provide a means for utilizing an improved material such as hydrogenated silicon as a barrier in conjunction with niobium electrodes, because of the particularly desirable properties of niobium as disclosed above. Such is the novelty of the present invention wherein it is recognized that application of a non-homogeneous barrier, having a concentration of hydrogen in its center portion and pure silicon at the interface with the niobium electrodes will provide the desired advantages without poisoning.

In Applicant's prior U.S. Pat. No. 4,176,365, assigned to the Assignee of the present invention, a Josephson tunnel junction device having hydrogenated amorphous silicon tunneling barriers was described. It is well known that hydrogenated sputtered silicon layers have different characteristics from unhydrogenated silicon layers. For example, pure silicon films have a room temperature resistivity on the order of $5 \times 10^5$ ohm-centimeters, while hydrogenated silicon alloy films have a resistivity of the order of $5 \times 10^8$ ohm-centimeters. The higher resistivity of hydrogenated amorphous silicon is generally explained as being due to the great reduction of localized states (which permit mobile electrons to "hop" between such states) within the bandgap of the material, since hydrogen atoms can satisfy otherwise unsatisfied "dangling bonds" of the silicon lattice without causing further distortion in atomic positions. The presence of the localized states permits what may be called "hopping" conduction which lowers the resistivity of the material. Hopping conduction is caused by thermally activated jumps between states. The presence of these localized states is believed to contribute to the excess conductivity in silicon tunnel barriers at voltages which are below the sum of the superconducting energy gaps at cryogenic temperatures.

For purposes of discussion, the localized states may be considered as stepping stones. An electron, or quasi-particle, can tunnel first from one electrode to an intermediate localized state and then to the opposite electrode. Further, an electron or quasi-particle could jump between a number of tunnel step states within the barrier.

Localized states which are geometrically situated in the middle of the barrier are those which will make the greatest contribution to excess tunnel currents. (It should be noted that an ideal Josephson tunnel junction permits only electrode-to-electrode tunneling and thus has less leakage current.) Thus, if only the central region is free, or relatively free from localized states, then the entire barrier will not support excessive leakage and it is not necessary to have the entire barrier formed from amorphous hydrogenated silicon, thus permitting layers of the barrier adjoining the electrodes to be comprised of substantially pure silicon. The contribution to the excess current is sharply peaked for those localized states precisely near the center of the barriers. This concept is illustrated by the experimental I-V curves shown herein in FIG. 8 wherein substantial reduction in leakage current was obtained by hydrogenating only the core, which was approximately 60% of the total barrier thickness. A clear improvement in the I-V curve as compared with prior art FIG. 7 is seen in the reduced slope below the energy gap $V_g$, the sharp rise in quasi-particle current above $V_g$, and the substantial increase in critical current $I_c$.

Such a model of localized states may also be used to explain the improvement in the $I_c R_n$ product. Generally, it is expected that the localized states can aid only the conduction of single electrons (quasi-particles) and not that of the weakly bound pairs of electrons responsible for superconductivity. However, the extra conductance provided by the localized states also reduces $R_n$ or the "normal resistance" observed at voltages above the energy gap, but will not tend to increase the electron pair current which is the zero voltage Josephson current. A reduction below the ideal $I_c R_n$ product is therefore expected for unhydrogenated silicon barriers.

It will also be appreciated by those skilled in the art that since the central feature of this invention is the provision of a barrier with reduced localized states in its central region, and since native oxide barriers have been used by the prior art in the formulation of superconducting tunnel junctions, that a purposely formed inhomogeneous native oxide barrier may be capable of providing a reduced density of local states when properly treated. Such treatment could consist of adding hydrogen to a plasma oxidation or otherwise doping the barrier. A limitation of this application is that electrodes formed from niobium might be poisoned and therefore such an oxide would have to be compatible with the base electrode.

Figure 12:
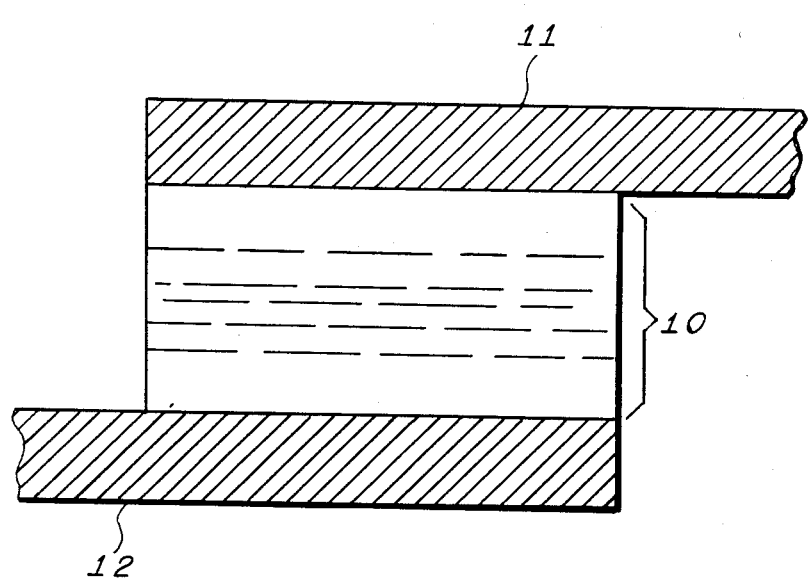
FIG. 12 is an enlarged side elevation view of an embodiment of the invention using a native oxide inhomogenous tunneling barrier.

FIG. 12 shows a structure embodying an inhomogenous native oxide of superconductive material. Electrode 12, which may be comprised of a superconductive metal such as lead, has grown thereupon a native oxide 10, as by plasma oxidation in an argon-oxygen discharge. A second superconductive electrode 11 is deposited on the exposed oxide surface. The native oxide is applied while exposing the barrier during formation to one of the gaseous atmospheres described above, such as hydrogen, so as to result in a low density of a localized states in the central region of the barrier 10, thereby resulting in minimizing leakage currents through the barrier, where the electrode is selected from a compatible superconductive material so that the superconducting transition temperature of the layers is not lowered. While the Figure is shaded to represent a graduated disposition of the gaseous element, this is not essential so long as the oxide thus formed is compatiable with the base electrode in the sense of avoiding poisoning of the electrode.

It should be noted that the advantages of freedom from a high density of localized states in a superconducting tunnel junction device may also be obtained with a uniform barrier. One example is the prior art hydrogenated silicon. The disadvantage of this structure, at least in a sputtering type application of the barrier, is that hydrogen can poison niobium superconducting electrodes, which are employed because of their advantageous properties. Lower concentrations of hydrogen which would not poison the electrodes and yet provide essentially the full benefits which have been obtained from the specific concentration of hydrogen used in the above embodiments may be useful. Further, other gaseous atmospheres such as hydrogen plus fluorine, hydrogen plus oxygen, or fluorine plus oxygen in combination, with the proper partial pressures, may not result in poisoning of niobium electrodes.

It will be clear to those skilled in the art that although amorphous hydrogenated silicon demonstrates the reduced density of localized states, any barrier materials having a minimum of localized states are within the purview of the present invention. Semiconductive materials, such as germanium, gallium arsenide, silicon, and alloys thereof, would be useful as a barrier material. Other superconductive alloys may also prove suitable as electrodes. In particular, preferred embodiments include niobium, niobium plus nitrogen, niobium plus tin, vanadium plus silicon niobium plus nitrogen and carbon, niobium plus germanium, and niobium plus germanium and silicon, which offer improved transition temperature properties over many prior art electrode materials. Other barrier materials in which the density of localized states may be reduced would include most or all of the Group IV or III-V semiconductors into which hydrogen, fluorine or oxygen have been introduced.

Further, while the barriers described herein have been sputter deposited in a gaseous atmosphere, it will be appreciated that other methods of deposition are also suitable. Thus, a direct current deposition, a radio frequency sputter deposition method, glow discharge deposition or combinations of these methods may be used in fabricating the inhomogeneous barrier.

Figure 9:
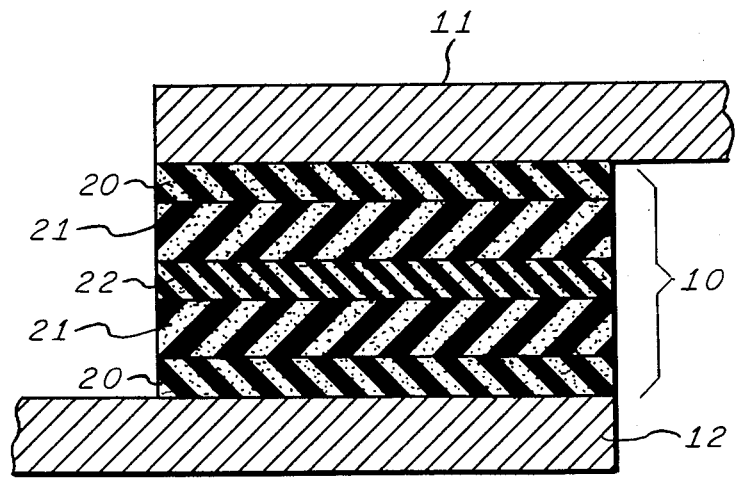
FIG. 9 is an enlarged side elevation view in cross-section of a superconducting tunnel junction device of the present invention, taken along line 2—2 of FIG. 1, showing a multiple layer hydrogenated barrier.

Other composite structures for the barrier within the purview of the present invention are based on the theory propounded above. For example, FIG. 9 shows a superconducting tunnel junction device where the barrier layer is further comprised of upper and lower layers of untreated semiconductor material 20, which adjoin each respective layer of superconductive material 11, 12, and a multiplicity of layers of gaseous treated semiconductive material 21, 22 as a core, and where the gaseous concentration is varied during treatment of the inner layers 21, 22 to be a maximum in the central region 22 and to decrease to a relatively low concentration in the layers 21 interposed between the untreated layers 20 and the core 22. An advantage of this strucuture is that it may be possible to produce tunnel junction devices with more uniform barrier thickness across one or more wafer substrates, while still maintaining the improved I-V characteristic curve (FIG. 8) of the structure exemplified in FIG. 4. This improved uniformity may be achievable as only a relatively thin layer of very heavily hydrogenated silicon might be required to reduce subgap leakage currents. The preferred process of fabricating a heavily hydrogenated layer requires the addition of a higher concentration of hydrogen to the argon plasma and a sputter deposition process, which tends to produce a less uniform layer. Uniformity of the barrier layer is critical to maintaining reproducible and desirable characteristics, although not to the effectiveness of the basic concepts expressed herein. By using a relatively thin heavily-hydrogenated layer, it is expected there would be less total variation in barrier thickness and hence a smaller gradient in device resistance as a function of position on a wafer.

Referring back to FIG. 9, this concept of course may be extended to providing additional intermediate layers of progressly decreasing concentration of the gaseous element, as by hydrogenation of a multiplicity of silicon layers.

Figure 10:
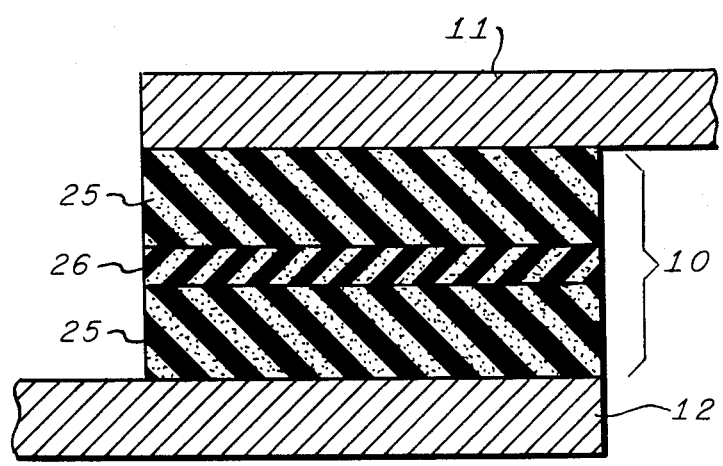
FIG. 10 is a view similar to that of FIG. 4, showing an alternate embodiment with modified depth of the barrier layers.

FIG. 10 represents an alternative structure wherein the core layer 26 is relatively thin as compared to the adjoining untreated semiconductive layers 25, 26. This structure again affords the possibility of producing more uniform barrier thickness across the wafer.

Figure 11A:
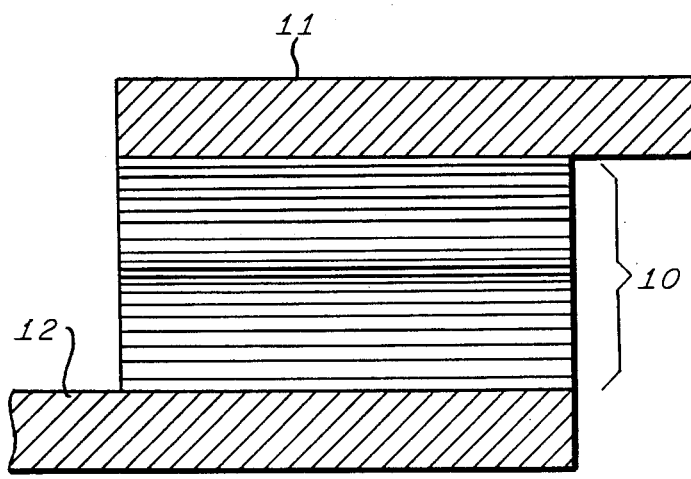
FIG. 11a is an enlarged side elevation view in cross-section, taken along line 2—2 of FIG. 1, of a superconducting device of the present invention, incorporating a single barrier with graduated hydrogen density therein.

Yet another structure is shown in FIG. 11a where barrier layer 10 contemplates continous variation in the concentration of the gaseous element rather than a number of discrete layers. This could be achieved, for example, by providing a varying concentration of hydrogen during the deposition of the barrier, as shown in the bell shaped distribution curve 11b. Such variation in the instantaneously desired concentration of hydrogen in the sputtering atmosphere is not necessarily proportional to the concentration of hydrogen desired in the sputtered layer because of the varying rates at which hydrogen is incorporated into the underlying silicon layer and the rate at which the hydrogen is pumped out of the treatment chamber as a function of concentration in the vacuum system.

Figure 11B:
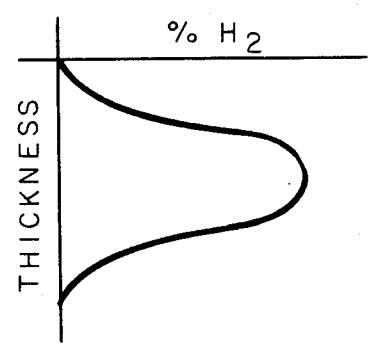
FIG. 11b is a diagrammatic representation of the variation in the degree of hydrogenation with distance from an edge of the barrier.

As shown in FIG. 11a, the invention is comprised of upper and lower superconductive layers 11, 12, substantially free of any gaseous component, and a non-homogenous barrier 10, where the barrier is comprised, for example, of a silicon layer impregnated with a variably predetermined concentration of a gas such as hydrogen. The varying density of the horizontal lines shown in barrier 10 corresponds to the continuously varying concentration of the gaseous component, shown schematically at FIG. 11b. In this embodiment it may be seen that barrier 10 has a maximum concentration centrally disposed within the barrier, and returns substantially to zero at the interface of barrier 10 with layers 11 and 12. By this structure, the central region of barrier 10 is relatively free of localized states so as to minimize leakages through the barrier, while the interfaces with layers 11, 12 are substantially free of a gaseous component which could otherwise result in lowering the superconducting transition temperature of the superconductive layers.

While the invention has been described in its preferred embodiments, it is to be understood that the words which have been used are words of description rather than limitation and changes may be made within the purview of the appended claims without departing from the true scope and spirit of the invention in its broader aspects.

I claim:

1. A superconducting tunnel junction device comprising:
   (a) first and second layers of superconductive material superposed with respect to each other,
   (b) barrier means fabricated by deposition in a gaseous atmosphere superposed between said first and second superconductive layers whereby tunneling current can flow therethrough between said superconductive layers, and
   (c) said barrier means including semiconductive material with a portion having a substantially reduced density of localized states so as to minimize leakage current through said barrier, and a portion of said barrier means at the interface with at least one of said first and second superconductive layers with a normal density of localized states.

2. The junction device of claim 1 in which said barrier means is a composite comprised of a core of amorphous, treated semiconductive material, bounded by at least one upper and at least one lower layer of untreated semiconductive material.

3. The junction device of claim 2 wherein said treated semiconductive material is comprised of hydrogenated amorphous silicon and said upper and lower layers are comprised of amorphous silicon substantially free from hydrogen.

4. The junction device of claim 1, wherein said barrier means is further comprised of a continuously varying concentration of at least one gaseous component, such that said concentration reaches zero at the interface with said first and second layers of superconductive material and maximum concentration is obtained at the central region of said barrier, such that the central region is relatively free of localized states so as to minimize leakage through said barrier, while said interfaces are substantially free of said gaseous component so as to avoid lowering the superconducting transition temperature of said superconductive layers.

5. The junction device of claim 1, wherein said barrier means is a composite comprised of a core of at least two layers of amorphous semiconductive material, including one untreated layer adjoining said first superconductive electrode and a second treated layer adjoining said second superconductive electrode, said second electrode having a composition which retains its superconducting transition temperature when in contact with said treated barrier layer.

6. The junction device of claim 2, wherein said barrier means is further comprised of a layer of untreated semiconductive material adjoining each layer of superconductive material, and a multiplicity of superposed layers of treated semiconductive material as a core, having a central region and bounded by said layers of untreated semiconductive material, wherein said central region is relatively free of localized states, and the successive adjacent layers have gradually increasing concentrations of localized states, becoming a normal concentration of localized states at each of said layers of untreated semiconductive material.

7. A superconducting tunnel junction device comprising:
   (a) first and second layers of superconductive material superposed with respect to each other,
   (b) barrier means superposed between said first and second superconductive layers whereby tunneling current can flow therethrough between said superconductor layers,
   (c) said barrier selected from the group of amorphous semiconductive materials consisting of silicon, germanium, gallium arsenide, and alloys thereof, and
   (d) said semiconductive material is deposited in the presence of a gaseous atmosphere, in a concentration sufficient to reduce the density of localized states in at least the central region of said barrier so as to minimize leakage current through said barrier, without lowering the superconducting transition temperature of said superconductive layers.

8. A superconducting tunnel junction device comprised of first and second layers of superconductive material superposed with respect to each other, and a barrier layer superposed between said first and second superconductive layers whereby tunneling current can flow therethrough between said superconductive layers, wherein said barrier layer is comprised of an inhomogeneous native oxide of said superconductive material, said native oxide being applied to provide a low density of localized states in the central region of said barrier so as to minimize leakage current through said barrier, without lowering the superconducting transition temperature of said superconductive layers.

9. A superconducting tunnel junction device comprising:
   (a) first and second layers of superconductive material superposed with respect to each other,
   (b) barrier means superposed between said first and second superconductive layers whereby tunneling current can flow therethrough between said superconductor layers,
   (c) said barrier means is selected from the group consisting of Group IV and Group III-V amorphous semiconductive materials, and
   (d) said semiconductive material is deposited in the presence of a gaseous atmosphere, in a concentration sufficient to reduce the density of localized states in at least the central region of said barrier so as to minimize leakage current through said barrier, without lowering the superconducting transition temperature of said superconductive layers, and said gaseous atmosphere is comprised of a mixture of an inert gas and a gas selected from the group consisting of hydrogen, fluorine and oxygen.

10. The junction device of claim 1 or 7, in which said gaseous atmosphere is comprised of a mixture of an inert gas and a gas selected from the group consisting of hydrogen, fluorine and oxygen.

11. The junction device of claim 1, 7, or 9 in which said barrier means is formed by sputter deposition in said gaseous atmosphere.

12. The junction device of claim 1, 7, or 9 in which said barrier layer is formed by direct current deposition in a gaseous atmosphere.

13. The junction device of claim 1, 7, or 9 in which said barrier layer is formed by r.f. sputter deposition.

14. The junction device of claim 1, 7, or 9 in which said barrier layer is formed by glow-discharge deposition.

15. The junction device of claim 1, 7, or 9 in which said barrier is formed by a combination of r.f. sputter deposition and glow-discharge sputter deposition.

16. The junction device of claim 1, 7, 8, or 9 wherein said superconductive layers are selected from the group of metals consisting of niobium, niobium plus nitrogen, niobium plus tin, vanadium plus silicon, niobium plus nitrogen and carbon, niobium plus germanium, and niobium plus germanium and silicon.

* * * * *